(12) United States Patent
Park et al.

(10) Patent No.: US 8,569,766 B2
(45) Date of Patent: Oct. 29, 2013

(54) ORGANIC LIGHT-EMITTING DISPLAY DEVICE AND METHOD OF MANUFACTURING THE SAME

(75) Inventors: Sun Park, Yongin (KR); Chun-Gi You, Yongin (KR); June-Woo Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 67 days.

(21) Appl. No.: 13/177,899

(22) Filed: Jul. 7, 2011

(65) Prior Publication Data

US 2012/0256186 A1  Oct. 11, 2012

(30) Foreign Application Priority Data

Apr. 5, 2011 (KR) .................. 10-2011-0031307

(51) Int. Cl.
*H01L 33/16* (2010.01)
(52) U.S. Cl.
USPC ............ 257/72; 257/52; 257/59; 257/257; 257/290

(58) Field of Classification Search
USPC .......... 257/52, 59, 72, 83, 257, 290, E27.112, 257/E27.131
See application file for complete search history.

(56) References Cited

U.S. PATENT DOCUMENTS

2008/0073649 A1* 3/2008 Kim et al. ............... 257/72

FOREIGN PATENT DOCUMENTS

| KR | 1020060104533 | 10/2006 |
| KR | 1020090048524 | 5/2009 |

* cited by examiner

*Primary Examiner* — Tran Tran
(74) *Attorney, Agent, or Firm* — Knobbe Martens Olson & Bear LLP

(57) ABSTRACT

Disclosed is an organic light-emitting display device including a transparent substrate which includes a display portion and a pad portion formed in a region around the display portion, a first semiconductor layer formed on the display portion, a second semiconductor layer formed on the pad portion, and a transparent electrode formed on each of the first the second semiconductor layers, where the first and second semiconductor layers include the same material.

10 Claims, 15 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims priority from Korean Patent Application No. 10-2011-0031307 filed on Apr. 5, 2011 in the Korean Intellectual Property Office, the disclosure of which is incorporated herein by reference in its entirety.

BACKGROUND

1. Field

The present disclosure relates to an organic light-emitting display device and a method of manufacturing the same, where the organic light-emitting display device is structured such that indentation impressions formed on a pad portion thereof can be clearly detected.

2. Description of the Related Technology

The rapid development of the information technology (IT) industry is dramatically increasing the use of display devices. Recently, there have been demands for display devices that are lightweight and thin, consume low power and provide high resolution. To meet these demands, liquid crystal displays or organic light-emitting displays having a plurality of metal wirings and light-emitting elements are being developed, among other displays.

Organic light-emitting displays, which are next-generation display devices having self-emitting light characteristics, have better performance than liquid crystal displays in terms of viewing angle, contrast, response speed and power consumption, and can be manufactured to be thin and lightweight since a backlight is not required.

Typically, a driving signal transmitted from a drive circuit board is delivered to each pixel of an organic display panel via a pad portion that connects the drive circuit board to the organic display panel. As a result, a desired image can be formed.

It is important for a connection portion of the drive circuit board and the pad portion of the organic display panel to be accurately bonded together to deliver a driving signal accurately. For this reason, after the connection portion of the drive circuit board and the pad portion of the organic display panel are bonded together, a connection state between the connection portion and the pad portion is identified based on indentation impressions formed on the pad portion when the connection portion and the pad portion are pressed against each other.

If the pad portion is made of metal, the indentation impressions can be detected clearly. However, in a bottom emission type organic light-emitting display, the pad portion is made of a transparent conductive material such as ITO. Thus, since the pad portion transmits most of light instead of reflecting the light, the indentation impressions cannot be clearly detected. Accordingly, it is difficult to determine the connection state between the connection portion and the pad portion, and to filter out panels with potential connection defects, leading to an increased defect rate of mass-produced products.

SUMMARY OF CERTAIN INVENTIVE ASPECTS

Aspects of the present disclosure provide an organic light-emitting display device structured such that indentation impressions indicating a connection state between a connection portion of a drive circuit board and a conductive pad portion of an organic display panel can be clearly detected even when the conductive pad portion is a transparent pad portion formed of a transparent electrode, and a method of manufacturing the organic light-emitting display device.

Aspects of the present disclosure also provide a method of inspecting whether an organic light-emitting display device, which is structured such that indentation impressions indicating a connection state between a connection portion of a drive circuit board and a transparent pad portion of an organic display panel can be clearly detected, is defective.

Aspects of the present invention are not restricted to the one set forth herein. The above and other aspects will become more apparent to one of ordinary skill in the art to which the present invention pertains by referencing the detailed description given below.

According to an aspect, there is provided an organic light-emitting display device including: a transparent substrate including a display portion and a pad portion formed in a region around the display portion, a first semiconductor layer formed on the display portion of the transparent substrate, a second semiconductor layer formed on the pad portion of the transparent substrate, and a transparent electrode formed on the first semiconductor layer and the second semiconductor layer, wherein the first semiconductor layer and the second semiconductor layer are made of the same material.

According to another aspect, there is provided an organic light-emitting display device including: a transparent substrate including a display portion and a pad portion formed in a region around the display portion, a semiconductor layer formed on the display portion of the transparent substrate, a light reflecting layer formed of a metal material on the pad portion of the transparent substrate, and a transparent electrode formed on the light reflecting layer.

According to another aspect, there is provided a method of manufacturing an organic light-emitting display device, the method including: providing a transparent substrate which comprises a display portion and a pad portion formed in a region around the display portion, forming a first semiconductor layer on the display portion of the transparent substrate and forming a second semiconductor layer on the pad portion of the transparent substrate, forming a transparent electrode on the second semiconductor layer, providing a drive circuit board having a connection portion which is connected to the transparent electrode, interposing a conductive adhesive layer between the transparent electrode and the connection portion, pressing the transparent electrode and the connection portion against each other to be attached to each other, and determining a connection state between the transparent electrode and the connection portion based on the shape of indentation impressions formed on the pad portion.

BRIEF DESCRIPTION OF THE DRAWINGS

The above and other aspects and features will become more apparent by describing in detail certain embodiments with reference to the attached drawings, in which.

DETAILED DESCRIPTION OF CERTAIN INVENTIVE EMBODIMENTS

The present disclosure will now be described more fully hereinafter with reference to the accompanying drawings, in which certain embodiments of the invention are shown. This invention may, however, be embodied in different forms and should not be construed as limited to the embodiments set forth herein. Rather, these embodiments are provided so that this disclosure will be thorough and complete, and will convey the scope of the invention to those skilled in the art. The same reference numbers generally indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1A:
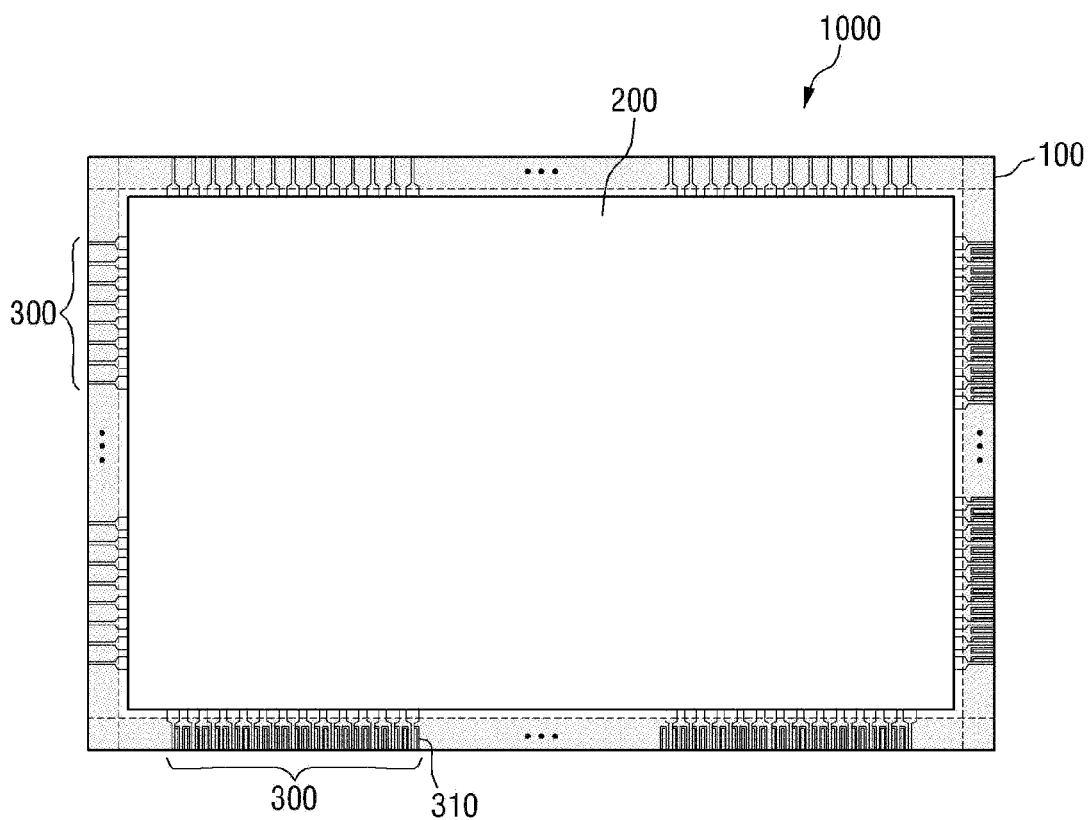
FIGS. 1A and 1B are plan views of an embodiment of an organic panel of an organic light-emitting display device.
Figure 1B:
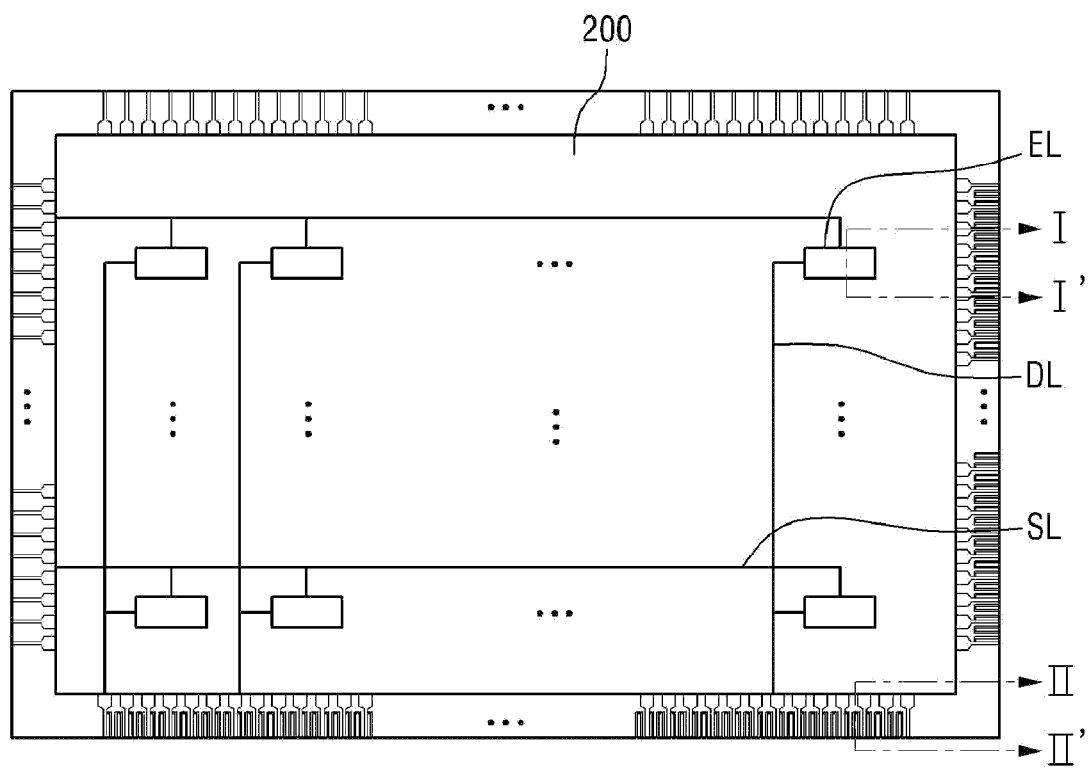

An embodiment of an organic light-emitting display device will be described with reference to FIGS. 1A and 1B. FIG. 1A is a plan view of an embodiment of an organic panel 1000 of an organic light-emitting display device. FIG. 1B schematically illustrates the configuration of a display portion 200 shown in FIG. 1A.

Figure 2:
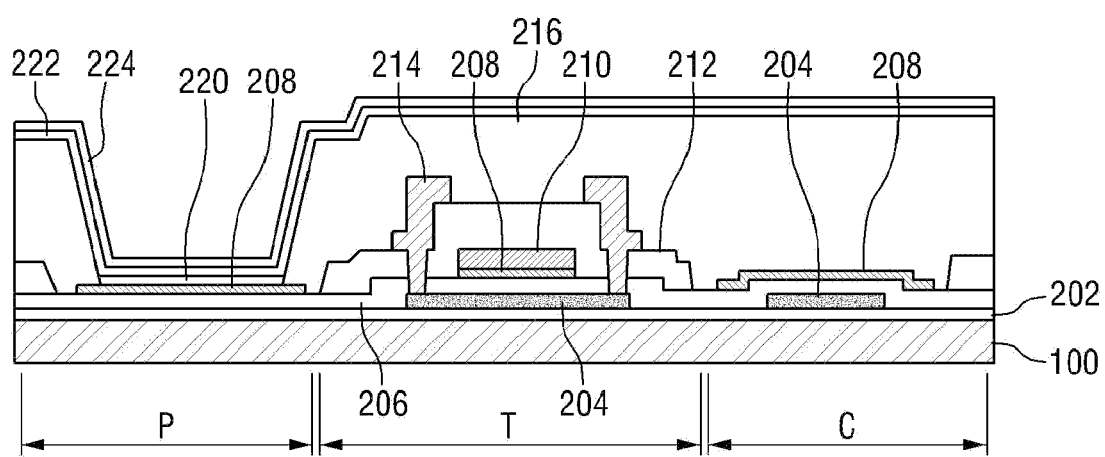
FIG. 2 is a cross-sectional view taken along line I-I' of FIG. 1B.
Figure 3:
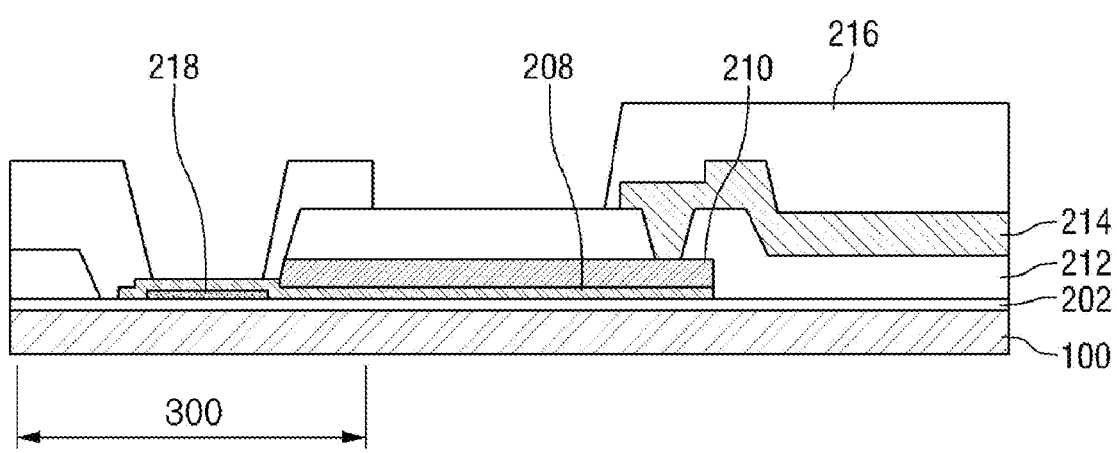
FIG. 3 is a cross-sectional view taken along line II-II' of FIG. 1B.

An embodiment of the organic light-emitting display device includes a transparent substrate 100 which includes the display portion 200 and a pad portion 300 formed in a region around the display portion 200, a first semiconductor layer 204 which is formed on the display portion 200 of the transparent substrate 100, a second semiconductor layer 218 which is formed on the pad portion 300 of the transparent substrate 100, and a transparent electrode 208 which is formed on the first semiconductor layer 204 and the second semiconductor layer 218 (see FIGS. 2 and 3). In some embodiments, the first semiconductor layer 204 and the second semiconductor layer 218 are made of the same material.

Referring to FIG. 1A, the organic panel 1000 includes the transparent substrate 100. The transparent substrate 100 may be made of a transparent glass material containing $SiO_2$ as a main component. The transparent substrate 100 may also be made of transparent plastic. The plastic that forms the transparent substrate 100 may include an insulating organic material. In various embodiments, the insulating organic material may include polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), cellulose acetate propionate (CAP), and a combination of the same.

As will be described below, at least one buffer layer 202 may further be formed on the transparent substrate 100 to planarize the transparent substrate 100 and to prevent penetration of impurities into the transparent substrate 100.

The transparent substrate 100 may include the display portion 200 and the pad portion 300 located in the region around the display portion 200. The display portion 200 is located in the center of the transparent substrate 100. Various display elements and wirings for displaying images are disposed on the display portion 200 of the transparent substrate 100. The pad portion 300, including a plurality of pad electrodes 310 for connection with a drive circuit board 500, may be located in the region around the display portion 200 (see FIG. 4). The pad electrodes 310 connected to the wirings on the display portion 200 are disposed on the pad portion 300 of the transparent substrate 100.

A signal transmitted from the drive circuit board 500 is delivered to each pixel of the display portion 200 via the pad portion 300. Accordingly, each pixel emits light, thereby forming a desired image.

In some embodiments, the pad portion 300 is provided on four sides of the display portion 200. In other embodiments, the pad portion 300 can be provided on one or more of the four sides of the display portion 200, as desired.

Referring to FIG. 1B, a plurality of pixels may be formed on the display portion 200 of the transparent substrate 100. The pad electrodes 310 are connected respectively to conducting wires which electrically connect the pixels, specifically, various conducting wires for driving the display elements, such as a plurality of data lines DL, a plurality of scan lines SL and a power supply line. Accordingly, the pad portion 300 can deliver a driving signal transmitted from the drive circuit board 500 to the display portion 200 via each conducting wire connected thereto.

The pad electrodes 310 may all have the same or substantially the same line width, and may be arranged at predetermined intervals. The pad electrodes 310 may be made of a metal with high conductivity and/or high light transmittance. In some embodiments, the pad electrodes 310 may be made of, but not limited to, Ag.

The conducting wires may be formed on one surface or both surfaces of the transparent substrate 100. The conducting wires may form a circuit that performs different functions according to devices to which the conducting wires are applied. In some embodiments, each conducting wire may form an electric field in an organic layer 220, thereby causing the organic layer 220 to emit light.

As will be described below, the pad portion 300 is coupled to the drive circuit board 500 (see FIG. 4) on which various circuit devices such as a drive integrated circuit (IC), a controller IC, and a jumper IC may be mounted. The pad portion 300 can deliver an electrical signal input from an external source to each organic light-emitting element EL of the display portion 200.

A plurality of organic light-emitting elements EL may be formed on the display portion 200 of the transparent substrate 100 and may be connected in a matrix pattern between the scan lines SL and the data lines DL to define the pixels.

In a passive matrix organic light-emitting display device, the organic light-emitting elements EL may be connected in a matrix pattern between the scan lines SL and the data lines DL. In an active matrix organic light-emitting display device, the organic light-emitting elements EL may be connected in a matrix pattern between the scan lines SL and the data lines DL, and thin-film transistors (TFTs) T for controlling the operation of the organic light-emitting elements EL and capacitors C for sustaining signals may further be implemented (see FIG. 2).

The specific configuration of each of the organic light-emitting elements EL that constitute an embodiment of the organic light-emitting display device will be described with reference to FIG. 2. FIG. 2 is a cross-sectional view taken along line I-I' of FIG. 1B. As described above, each of the pixels that constitute the organic light-emitting display device may include one or more TFTs T, one or more capacitors C, and a light-emitting portion P in which the organic light-emitting layer 220 is deposited.

Specifically, an embodiment of the organic light-emitting display device may include the buffer layer 202, the first semiconductor layer 204, a gate insulating film 206, a gate electrode 210, an interlayer insulating film 212, source/drain electrodes 214, and a pixel defined layer 216 sequentially stacked on the transparent substrate 100. In other embodiments, the above components may be provided on the whole surface of the transparent substrate 100 or part of the surface of the transparent substrate 100 to form a TFT T or a capacitor C.

As described above, the transparent substrate 100 may be made of a transparent glass material containing $SiO_2$ as a main component. The transparent substrate 100 may contain transparent plastic or an insulating organic material. In a top emission organic light-emitting display device in which an image is realized away from the transparent substrate 100, the transparent substrate 100 may not necessarily be made of a transparent material. The embodiment of an organic light-emitting display device shown in FIGS. 1 and 2 is a bottom emission organic light-emitting display device, but the scope of the present invention is not limited to this embodiment.

The buffer layer 202 is formed on the transparent substrate 100 to planarize the transparent substrate 100 and to prevent penetration of impurities into the transparent substrate 100. The buffer layer 202 may be a single layer of SiOx, SiNx or SiO2Nx, or a multilayer of these materials.

The first semiconductor layer 204 may be formed on the buffer layer 202. The first semiconductor layer 204 may be made of various known semiconductor materials. In some embodiments, the first semiconductor layer 204 may contain silicon (Si). The first semiconductor layer 204 may be an amorphous silicon (a-Si) layer or a polycrystalline silicon (p-Si) layer. In other embodiments, the first semiconductor layer 204 may be made of, but not limited to, Ge, GaP, GaAs, or AlAs.

A portion of the first semiconductor layer 204 may be doped with P- or N-type impurities. In some embodiments, the first semiconductor layer 204 that constitutes a TFT T may be partially doped with impurities to have semiconductor properties, and the first semiconductor layer 204 that constitutes a capacitor C may be entirely doped with impurities to form an electrode.

The gate insulating film 206 may be formed on the first semiconductor layer 204 to cover the first semiconductor layer 204 and to insulate the first semiconductor layer 204 from the gate electrode 210. Like the buffer layer 202, the gate insulating film 206 may be a single layer of SiO2, SiNx or SiO2Nx, or a multilayer of these materials. The gate insulating film 206 may be made of the same or different material as the buffer layer 202.

The gate electrode 210 may be formed on the gate insulating film 206. The gate electrode 210 transmits a gate signal to control the light emission of each pixel. The gate electrode 210 may be a single layer of Al or an Al alloy, such as Cr—Al, Mo—Al or Al—Nd, or a multilayer of a Cr, Ti or Mo alloy and an Al alloy stacked on the Cr, Ti or Mo alloy.

In some embodiments, the transparent electrode 208 may further be provided under the gate electrode 210. The transparent electrode 208 may be made of a transparent conductive material, such as, for example, carbon nanotubes, metal nanowires, or a metal oxide such as ITO and/or IZO.

In some embodiments, the TFT T may include the transparent electrode 208 made of, for example, ITO, and the gate electrode 210 having, for example, a triple-layered structure of Mo—Al—Mo successively stacked on the transparent electrode 208.

The transparent electrode 208 of a predetermined width may be formed not only in the TFT region T, but also in the capacitor region C and the light-emitting portion P.

The interlayer insulating film 212 may be formed on the gate electrode 210. The interlayer insulating film 212 electrically insulates the gate electrode 210 from the source/drain electrodes 214. Like the buffer layer 202, the interlayer insulating film 212 may be a single layer of SiO2, SiNx or SiO2Nx, or a multilayer of these materials. Contact holes (not shown) for forming the source/drain electrodes 214 may be formed in the interlayer insulating film 212.

The source/drain electrodes 214 may be formed on the interlayer insulating film 212 and electrically connected to the first semiconductor layer 204 by the contact holes. The source/drain electrodes 214 may be made of any one material selected from Mo, Cr, W, MoW, Al, Al—Nd, Ti, TiN, Cu, a Mo alloy, an Al alloy, and a Cu alloy. The source/drain electrodes 214 may also be formed as a triple layer of Mo—Al—Mo or Ti—Al—Ti.

The pixel defined layer 216 may be formed on the source/drain electrodes 214. The pixel defined layer 216 is formed on the whole surface of the transparent substrate 100 to cover the TFT T and the capacitor C. The pixel defined layer 216 may expose all or part of the transparent electrode 208 of the light-emitting portion P to define a pixel region. The pixel defined layer 216 may be made of an inorganic material, such as SiO2, SiNx or SiO2Nx, or may be a multilayer of these materials.

The organic layer 220 may be formed on the transparent electrode 208 of the light-emitting portion P. The organic layer 220 may include a hole injecting layer, a hole transporting layer, an emitting layer, an electron transporting layer, and an electron injecting layer stacked sequentially.

Holes injected from the hole injecting layer and electrons injected from the electron injecting layer combine together in the emitting layer to generate light. In the case of a top emission organic light-emitting display device, the generated light is emitted upward in FIG. 2 to exit through a cathode electrode 222 and a capping layer 224 above the emitting layer.

The organic layer 220 may further include an auxiliary hole transporting layer which helps holes to easily reach the emitting layer. The hole injecting layer may be made of the same material as the hole transporting layer.

The cathode electrode 222 is deposited on the organic layer 220 and may be made of, but not limited to, a metal, such as, for example, Cu or Ag.

The cathode electrode 222 forms an electric field together with an anode electrode (for example, the transparent electrode 208) under the organic layer 220, thereby causing the organic layer 220 to emit light.

The capping layer 224 is formed on the cathode electrode 222 and protects the internal components including the organic layer 220 and the cathode electrode 222. In particular, the capping layer 224 protects the cathode electrode 222 from air to prevent oxidation of the cathode electrode 222. Various types of material may be used to form the capping layer 224. In some embodiments, the capping layer 224 can be made of an organic material.

The specific configuration of the pad portion 300 of an embodiment of the organic light-emitting display device will be described with reference to FIG. 3. FIG. 3 is a cross-sectional view taken along line II-II' of FIG. 1B.

The configuration of the pad portion 300 of the transparent substrate 100 is identical to that of each organic light-emitting element EL described above with reference to FIG. 2. The buffer layer 202 may be formed on the transparent substrate 100, and the transparent electrode 208, the gate electrode 210, the interlayer insulating film 212, the source/drain electrodes 214 and the pixel defined layer 216 may be sequentially stacked on the buffer layer 202. Components of the pad portion 300 formed in a peripheral region of the transparent substrate 100 may be made of the same material as those of the TFT T and the capacitor C. In some embodiments, the transparent electrode 208 of the pad portion 300 may be made of the same material as the transparent electrode 208 of each of the TFT T, the capacitor C, and the light-emitting portion P.

The pad portion 300 is connected to a plurality of connection portions 510 of the drive circuit board 500 and delivers a driving signal transmitted from the drive circuit board 500 to each pixel as described above (see FIG. 4). The pad portion 300 may include the transparent electrode 208 exposed by the pixel defined layer 216, and the transparent electrode 208 may be connected directly to each connection portion 510 of the drive circuit board 500.

A driving signal transmitted to the transparent electrode 208 may be delivered to the source/drain electrodes 214 via the gate electrode 210 shown in FIG. 3 and may be transmitted to each of the organic light-emitting elements EL via the scan lines SL and the data lines DL described above.

The pad portion 300 of the organic light-emitting display device may further include the second semiconductor layer 218 under the transparent electrode 208. The second semiconductor layer 218 may have a predetermined light reflectivity.

As described above, the pad portion 300 is connected to each connection portion 510 of the drive circuit board 500 and delivers a driving signal transmitted from the drive circuit board 500 to each pixel. To identify the connection state between the pad portion 300 including the transparent electrode 208 and each connection portion 510 of the drive circuit board 500 more clearly, the second semiconductor layer 218 may be made of an opaque material.

Specifically, the second semiconductor layer 218 may be made of a material with a light reflectivity of about 40% or more, such that indentation impressions 620 (see FIG. 8A) formed on the transparent electrode 208 and the second semiconductor layer 218 can be detected by light reflected from the second semiconductor layer 218.

The second semiconductor layer 218 may be made of the same material as the first semiconductor layer 204 of each of the TFT T and the capacitor C. A semiconductor layer deposited in the display portion 200, in a region in which the TFT T and the capacitor C are formed, may be defined as the first semiconductor layer 204. A semiconductor layer deposited in the region around the display portion 200 in which the pad portion 300 is formed, may be defined as the second semiconductor layer 218. The first and second semiconductor layers 204 and 218 may be made of the same material. As described above, the second semiconductor layer 204 may contain Si, specifically, a-Si or p-Si.

The second semiconductor layer 218 may be wider than each aperture of the pad portion 300.

In various embodiments, a light reflecting layer may be interposed between the buffer layer 202 and the transparent electrode 208 of the pad portion 300. The light reflecting layer may be made of an opaque material with a predetermined light reflectivity. The light reflecting layer may be made of a material with a light reflectivity of about 40% or more, such that the indentation impressions 620 formed on the transparent electrode 208 and the light reflecting layer can be detected by light reflected from the light reflecting layer. The light reflecting layer may be made of a highly reflective metal material.

Another embodiment of an organic light-emitting display device may include a transparent substrate 100 which includes a display portion 200 and a pad portion 300 formed in a region around the display portion 200, a semiconductor layer 204 which is formed on the display portion 200 of the transparent substrate 100, a light reflecting layer which is formed of a metal material on the pad portion 200 of the transparent substrate 100, and a transparent electrode 208 which is formed on the light reflecting layer.

The indentation impressions 620 used to identify the connection state between the pad portion 300 including the transparent electrode 208 and each connection portion 510 of the drive circuit board 500 will be described in detail below.

Figure 4:
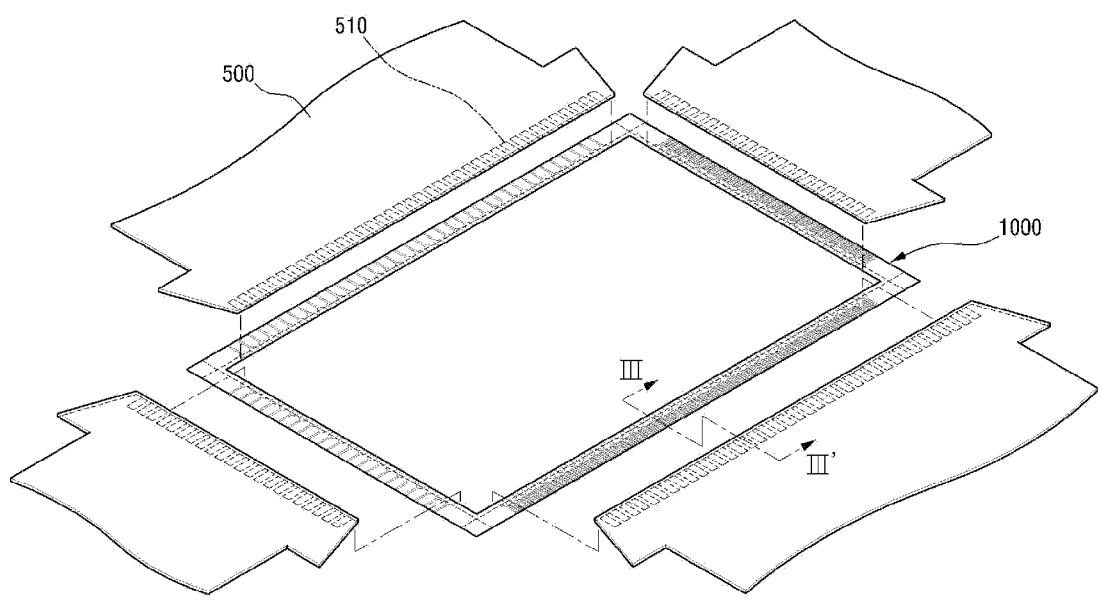
FIG. 4 is a perspective view showing the coupling structure between the organic panel and a drive circuit board in the embodiment of an organic light-emitting display device of FIG. 1.
Figure 5:
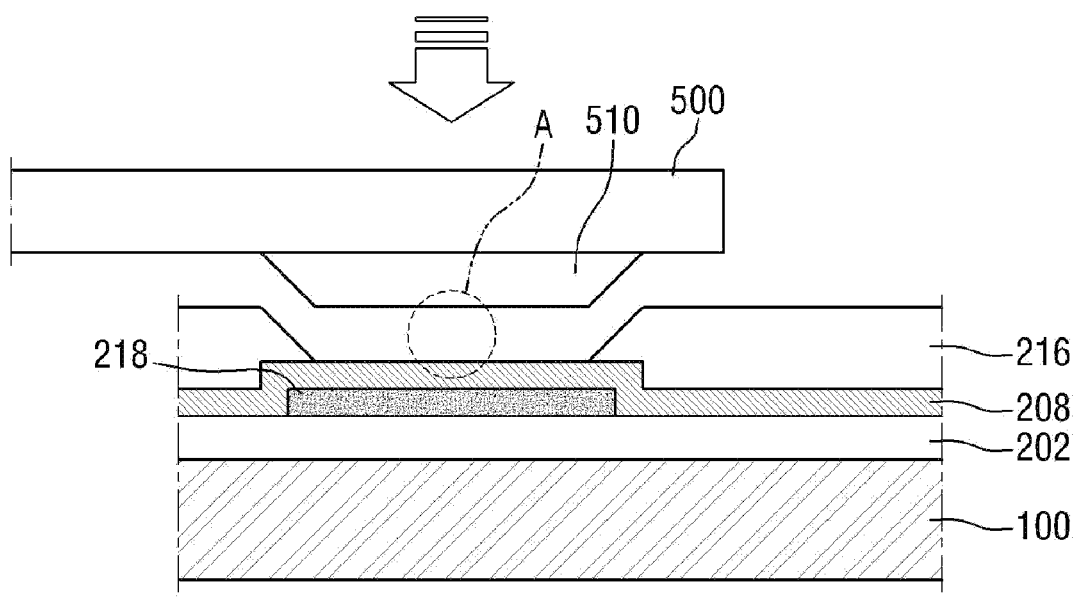
FIG. 5 is a cross-sectional view taken along line III-III' of FIG. 4.
Figure 6:
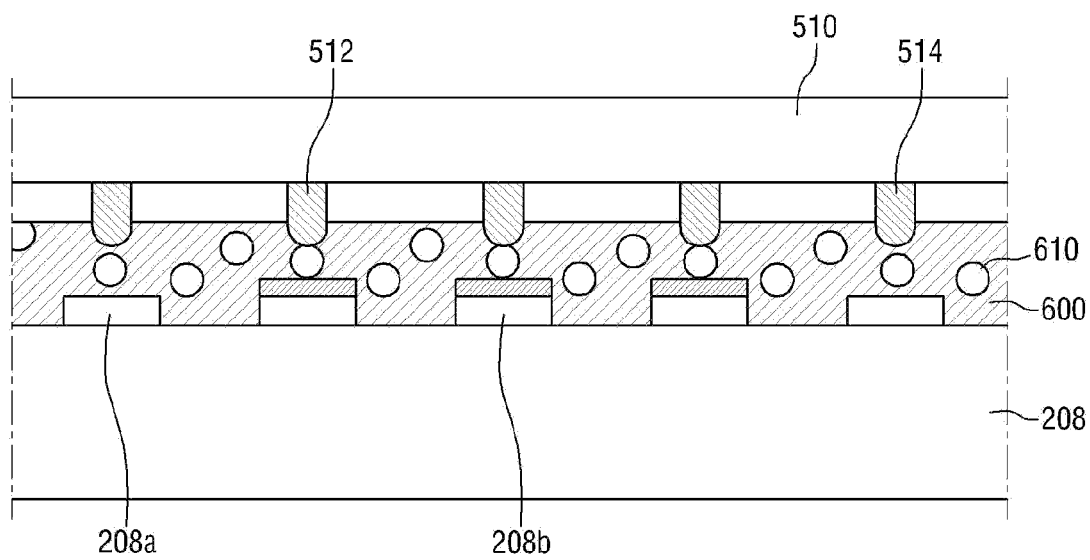
FIG. 6 is an enlarged view of region 'A' shown in FIG. 5.

The coupling structure of the embodiment of an organic light-emitting display device of FIG. 1 will be described with reference to FIGS. 4 through 6. FIG. 4 is a perspective view showing the coupling structure between the organic panel 1000 and the drive circuit board 500. FIG. 5 is a cross-sectional view taken along line III-III' of FIG. 4. FIG. 6 is an enlarged view of region 'A' shown in FIG. 5.

Referring to FIG. 4, the drive circuit board 500 may be connected to the pad portion 300 formed at each edge of the organic panel 1000. The drive circuit board 500 may be connected to all pad portions 300. In other embodiments, the connection portions 510 of the drive circuit board 500 may be connected to only some of the pad portions 300. In FIG. 4, the drive circuit boards 500 independent of each other are coupled to the pad portions 300 of the organic panel 100. The drive circuit boards 500 may also be connected to each other and coupled to the pad portions 300 accordingly. The shape of each driving circuit board 500 can be diversely modified.

A conductive adhesive layer 600 including conductive balls 610 may be coated on each connection portion 510 of the drive circuit board 500 and/or the pad portion 300 of the transparent substrate 100 of the organic panel 1000. Electrodes of each connection portion 510 of the drive circuit board 500 may be aligned to correspond respectively to the pad electrodes 310 of the pad portion 300 of the transparent substrate 100.

Specifically, referring to FIG. 5, each connection portion 510 of the drive circuit board 500 may be aligned over an aperture formed on the pad portion 300 of the transparent substrate 100 of the organic panel 1000. The drive circuit board 500 may be lowered to attach each connection portion 510 of the drive circuit board 500 to the pad portion 300. Accordingly, a driving signal can be transmitted from each connection portion 510 of the drive circuit board 500 to the pad portion 300 of the organic panel 1000.

In the embodiment of FIG. 5, the shape of the aperture formed on the pad portion 300 by the pixel defined layer 216 may correspond to the shape of each connection portion 510 of the drive circuit board 500. In other embodiments, each connection portion 510 may be narrower than the aperture of the pad portion 300.

As described above, the second semiconductor layer 218 may further be interposed between the transparent electrode 208 and the buffer layer 202 of the pad portion 300. Accordingly, the transparent electrode 208 may be at a higher height in the aperture region of the pad portion 300 than in adjacent regions, resulting in the formation of a step.

In FIG. 6, an enlarged cross-section of the region 'A' in which each connection portion 510 of the drive circuit board 500 is brought into contact with the pad portion 300 of the transparent substrate 100 of the organic panel 1000 is shown.

As described above, the pad portion 300 may be formed on one or more sides of the display portion 200 of the transparent substrate 100 and may be connected to the scan lines SL or the data lines DL extending from the scan lines SL or the data lines DL. The pad portion 300 may be connected to each connection portion 510 of the drive circuit board 500 to which a signal is input from an external source.

Referring to FIG. 6, each connection portion 510 of the drive circuit board 500 may include a plurality of bumps. The bumps may include first bumps 512 which are actually connected to the pad portion 300 thereunder and second bumps 514 which are not connected to the pad portion 300.

A plurality of first lead bonding pads 208b and a plurality of second lead bonding pads 208a may be formed on the transparent electrode 208 of the pad portion 300. The first lead bonding pads 208b correspond to the first bumps 512 and are connected to the first bumps 512, and the second lead bonding pads 208a correspond to the second bumps 514 and are not connected to the second bumps 514.

Since the first bumps 512 are connected to the first lead bonding pads 208b, the drive circuit board 500 may be connected to the organic light-emitting elements EL by the scan lines SL or the data lines DL. The first and second bumps 512 and 514 and the first and second lead bonding pads 208b and 208a may be formed in a row to correspond to each other.

The first and second bumps 512 and 514 may be made of a conductive metal material such as for example Au. In some embodiments, the first and second lead bonding pads 208b and 208a may be made of the same material as the transparent electrode 208 thereunder.

In FIG. 6, a plurality of lead bonding pads are formed on the transparent electrode 208. Alternatively, the second semiconductor layer 218 may be formed on the buffer layer 202, and the transparent electrode 208 may be patterned on the buffer layer 202 to form a plurality of lead bonding pads.

The lead bonding pads may also be made of a different material from the transparent electrode 208 thereunder.

In some embodiments, the second semiconductor layer 218 may not be interposed between the transparent electrode 208 and the buffer layer 202. Instead, an opaque conductive material may be deposited on a tip end of each lead bonding pad, such that the indentation impressions 620 of the pad portion 300 can be easily detected from behind the transparent substrate 100. The opaque conductive material may be any one material selected from the group consisting of Cr, Al, Mo, Ti, W, and Au.

Referring to FIG. 6, the conductive adhesive layer 600 (such as, for example, an anisotropic conductive film (ACF)) including the conductive balls 610 may be formed between the pad portion 300 and each connection portion 510, specifically, on the pad portion 300. Where the conductive adhesive layer 600 is interposed between the pad portion 300 and each connection portion 510, if the bumps of each connection portion 510 of the drive circuit board 500 are attached onto the lead bonding pads by thermo-compression, they may be electrically connected to the lead bonding pads by the conductive balls 610, respectively.

Since the pad portion 300 of the organic panel 1000 is connected to each connection portion 510 of the drive circuit board 500 having the controller IC and the driver IC by the conductive adhesive layer 600, it can deliver a signal transmitted from the drive circuit board 500 to each organic light-emitting element EL.

Figure 7:
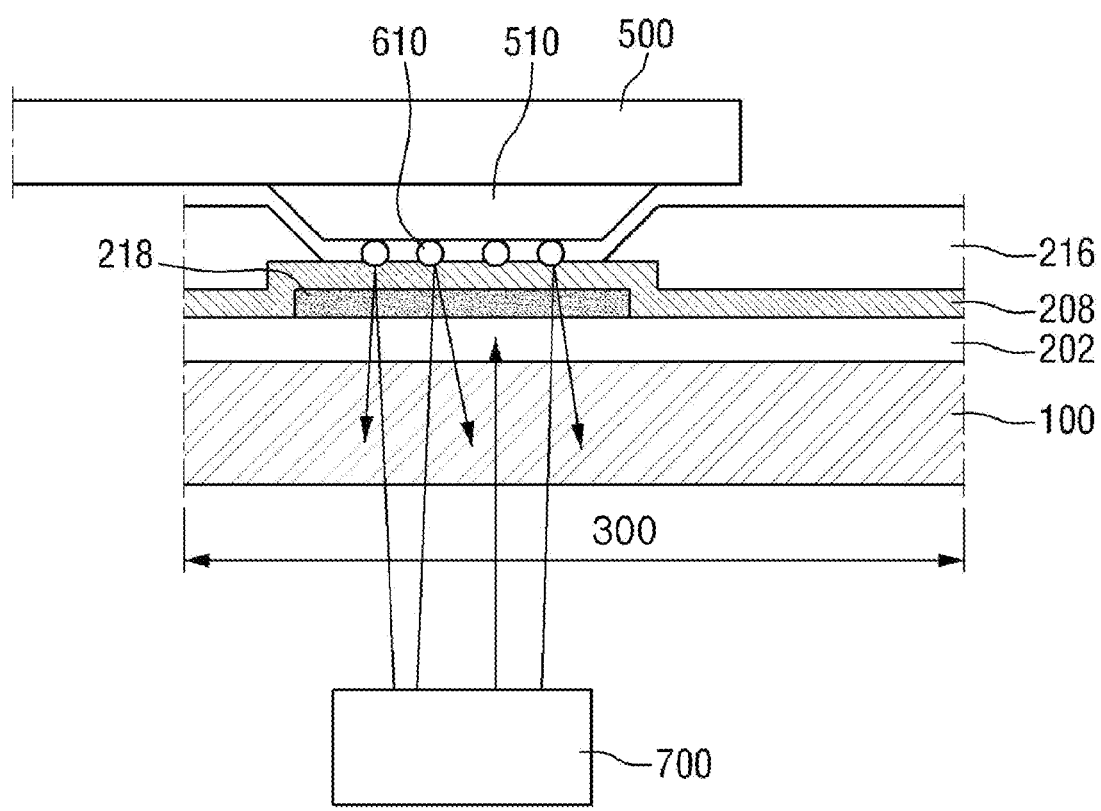
FIG. 7 is a diagram illustrating the inspection structure of a protrusion inspection apparatus.
Figure 8A:
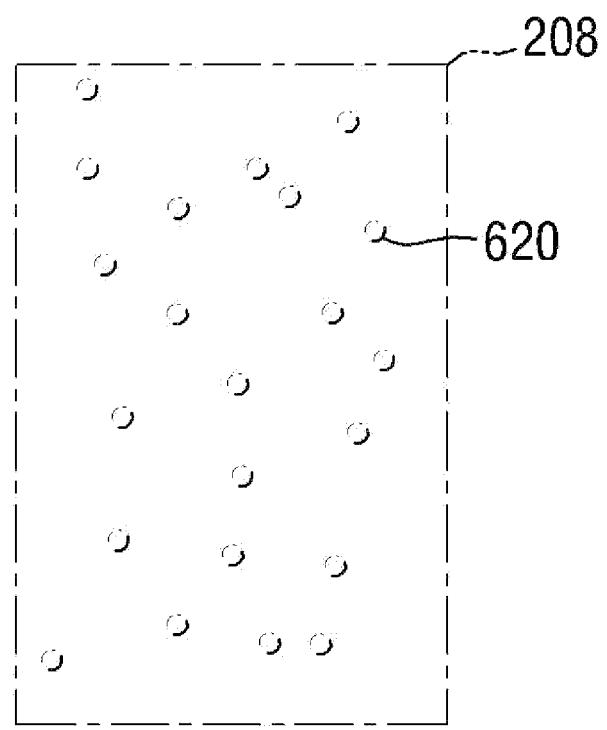
FIGS. 8A and 8B are diagrams for comparing the distributions and shapes of indentation impressions on a transparent electrode.
Figure 8B:
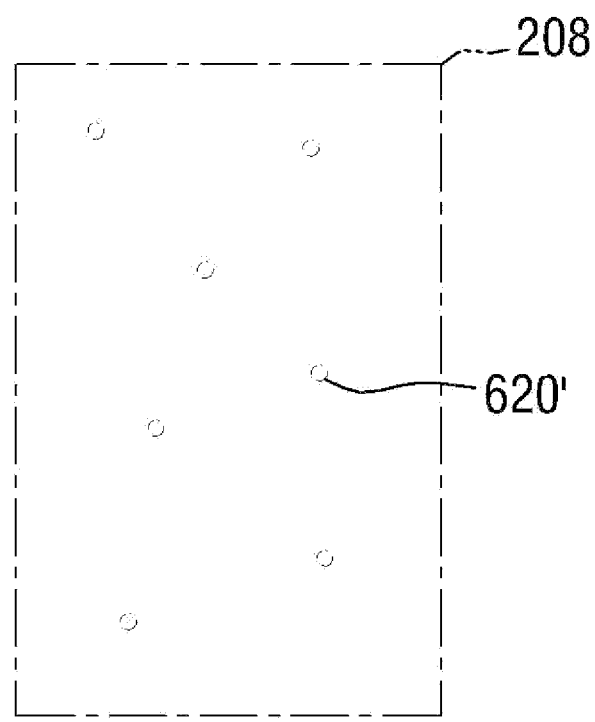
Figure 9A:
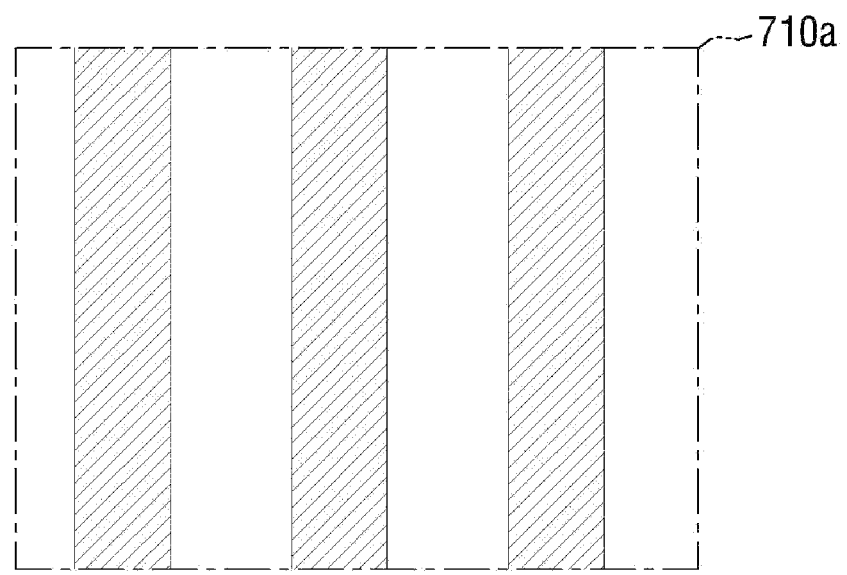
FIGS. 9A and 9B are diagrams for comparing the distributions and shapes of indentation impressions on the pad portion of the embodiment of an organic light-emitting display device of FIG. 1.
Figure 9B:
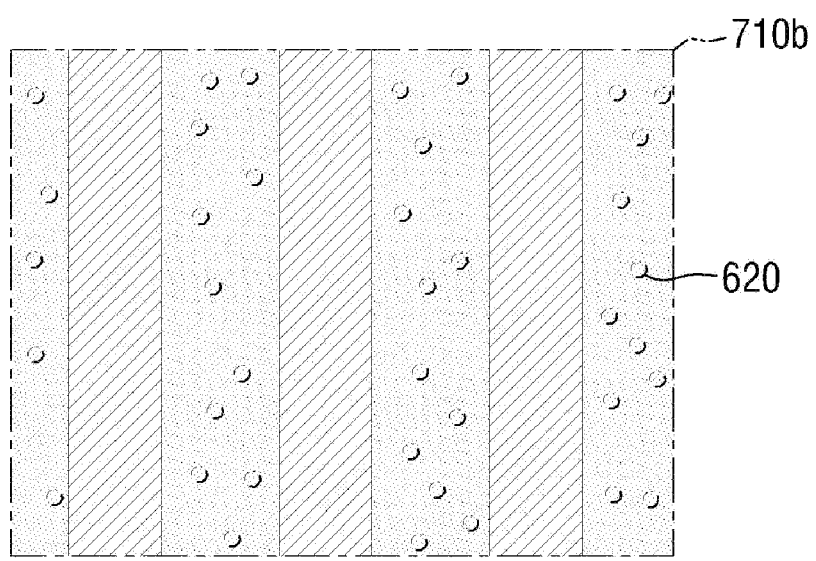

Hereinafter, an image capture unit 700 and the distribution of the indentation impressions 620 used to identify the connection state between the pad portion 300 and each connection portion 510 in the embodiment of an organic light-emitting display device of FIG. 1 will be described with reference to FIGS. 7 through 9B. FIG. 7 is a diagram illustrating the inspection structure of a protrusion inspection apparatus which identifies the connection state between the pad portion 300 and each connection portion 510 based on the indentation impressions 620 of the pad portion 300 of the embodiment of an organic light-emitting display device of FIG. 1. FIGS. 8A and 8B are diagrams for comparing the distributions and shapes of the indentation impressions 620 on the transparent electrode 208. FIGS. 9A and 9B are diagrams for comparing the distributions and shapes of the indentation impressions 620 on the pad portion 300 which are obtained by the image capture unit 700.

Referring to FIG. 7, after the pad portion 300 and each connection portion 510 are attached to each other, it is possible to examine from behind the transparent substrate 100 whether the first and second bumps 512 and 514 are accurately and electrically connected to the first and second lead bonding pads 208b and 208a by the conductive balls 610.

The image capture unit 700 irradiates light to the pad portion 300 and each connection portion 510 from behind the transparent substrate 100. The light is reflected from the pad portion 300 and from each connection portion 510 back to the image capture unit 700. Using the reflected light, the image capture unit 700 may output an image showing the shape and distribution of the indentation impressions 620 of the pad portion 300. A different image of the indentation impressions 620 of the pad portion 300 may be obtained according to the reflectivity of the second semiconductor layer 218 disposed under the transparent electrode 208.

As the first and second bumps 512 and 514 of each connection portion 510 are attached onto the pad portion 300, the indentation impressions 620 may be formed on the pad portion 300 by the conductive balls 610.

Referring to FIG. 8A, the indentation impressions 620 may be formed on a rear surface of the transparent electrode 208 when the conductive balls 610 are attached to the pad portion 300. If the indentation impressions 620 are evenly and densely distributed and protrude to a depth or height within a predetermined range, it can be determined that the pad portion 300 of the organic panel 1000 is accurately connected to each connection portion 510 of the drive circuit board 500.

On the other hand, referring to FIG. 8B, if indentation impressions 620' formed on the rear surface of the transparent electrode 208 are sparsely distributed and if the indentation impressions 620' are not formed or protrude excessively to a depth or height outside the predetermined range, it can be determined that a connection defect has occurred, such as for example, the pad portion 300 of the organic panel 1000 is not attached or overly attached to each connection portion 510 of the drive circuit board 500.

As described above, the indentation impressions 620 may be formed on the transparent electrode 208 by the conductive balls 610. If the second semiconductor layer 218 is not formed under the transparent electrode 208 of the pad portion 300, the indentation impressions 620 formed on the transparent electrode 208 cannot be observed in a first image 710a captured by the image capture unit 700, as shown in FIG. 9A. This is because the transparent electrode 208 with a transmittance of 90% or more transmits most of light.

Embodiments of the pad portion 300 which include the second semiconductor layer 218 under the transparent electrode 208 help enable the indentation impressions 620 formed on the transparent electrode 208 to be clearly observed in a second image 710b captured by the image capture unit 700, as shown in FIG. 9B.

Each connection portion 510 of the drive circuit board 500 is pressed against the transparent electrode 208 of the pad portion 300 to form the indentation impressions 620 on the transparent electrode 208 of the pad portion 300. The indentation impressions 620 formed on the transparent electrode 208 deform the second semiconductor layer 218 under the transparent electrode 208 to have protrusions and recesses, and light is diffusely reflected by the protrusions and recesses of the second semiconductor layer 218 having a predetermined light reflectivity. Accordingly, the indentation impressions 620 can be clearly observed in an image captured by the image capture unit 700 as shown in FIG. 9B.

As described above, the second semiconductor layer 218 may contain Si, specifically, a-Si or p-Si.

In some embodiments, a light reflecting layer may be provided instead of the second semiconductor layer 218 at the position of the second semiconductor layer 218. The light reflecting layer may be made of a metal or metal oxide with a light reflectivity of about 40% or more to ensure detection of the indentation impressions 620.

The light reflecting layer may also be deformed by the indentation impressions 620 of the transparent electrode 208b to have protrusions and recesses. Thus, the indentation impressions 620 can be clearly observed in an image captured by the image capture unit 700.

Figure 10:
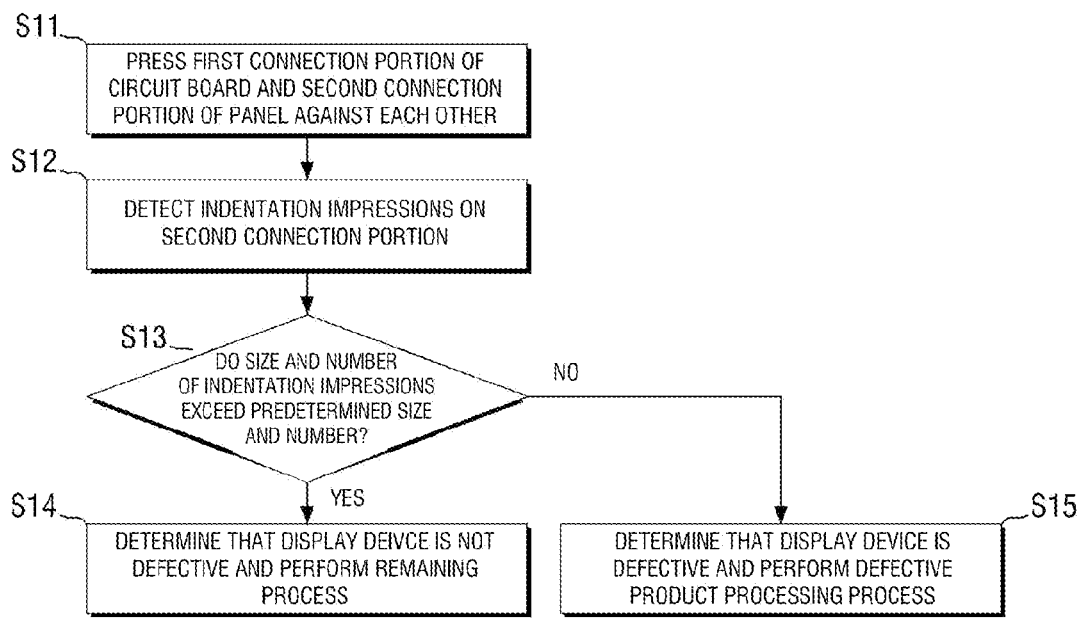
FIG. 10 is a flowchart illustrating an embodiment of a method of inspecting indentation impressions of an organic light-emitting display device.

An embodiment of a method of inspecting indentation impressions of an organic light-emitting display device will be described with reference to FIG. 10. FIG. 10 is a flowchart illustrating an embodiment of a method of inspecting indentation impressions of an organic light-emitting display device.

An embodiment of the inspection method includes pressing a first connection portion of a drive circuit board against a second connection portion of an organic panel (operation S11), detecting indentation impressions formed on the second connection portion (operation S12), determining whether the size and number of the indentation impressions exceed a predetermined size and number (operation S13), and determining that the organic light-emitting display device is not defective when the size and number of the indentation impressions exceed the predetermined size and number and performing the remaining process (operation S14). The second connection portion includes a transparent electrode and a second semiconductor layer formed under the transparent electrode.

The conductive adhesive layer 600 is interposed between each connection portion 510 of the drive circuit board 500 and the pad portion 300 of the transparent substrate 100, and each connection portion 510 of the drive circuit board 500 and the pad portion 300 of the transparent substrate 100 are pressed against each other from both sides or one side (operation S11). Then, the indentation impressions 620 may be formed on the pad portion 300 of the organic panel 1000 by the conductive balls 610.

The indentation impressions 620 thus formed are used to determine the connection state between each connection portion 510 and the transparent electrode 208 of the pad portion 300. If the indentation impressions 620 formed on the pad portion 300 are evenly and densely distributed and protrude to a depth or height within a predetermined range, it can be determined that the pad portion 300 of the organic panel 1000 is accurately connected to each connection portion 510 of the drive circuit board 500. On the other hand, if the indentation impressions 620 are sparsely distributed and if the indentation impressions 620 are not formed or protrude excessively to a depth or height outside the predetermined range, it can be determined that a connection defect has occurred, such as for example, that the pad portion 300 of the organic panel 1000 is not attached or overly attached to each connection portion 510 of the drive circuit board 500.

The second semiconductor layer 218 formed under the transparent electrode 208 of the pad portion 300 supplements the transparent electrode 208 from which an image of the indentation impressions 620 cannot be captured using the image capture unit 700. Accordingly, this leads to an increased detection rate of the indentation impressions 620.

Therefore, even when the pad portion 300 of the organic panel 1000 is formed of the transparent electrode 208 in a bottom emission organic light-emitting display device, the indentation impressions 620 indicating the connection state between each connection portion 510 of the drive circuit board 500 and the transparent pad portion 300 of the organic panel 1000 can be clearly detected. The clearly detected indentation impressions 620, in turn, make it possible to clearly identify the connection state between each connection portion 510 of the drive circuit board 500 and the pad portion 300 of the organic panel 1000, thereby preventing the production of a defective organic light-emitting display device.

In particular, when the second semiconductor layer 218 is formed of the same material as the first semiconductor layer 204, no additional facility is required since the existing production facility can be used to form the second semiconductor layer 218. Accordingly, this can save the cost for detection of the indentation impressions 620 of the pad portion 300.

Figure 11:
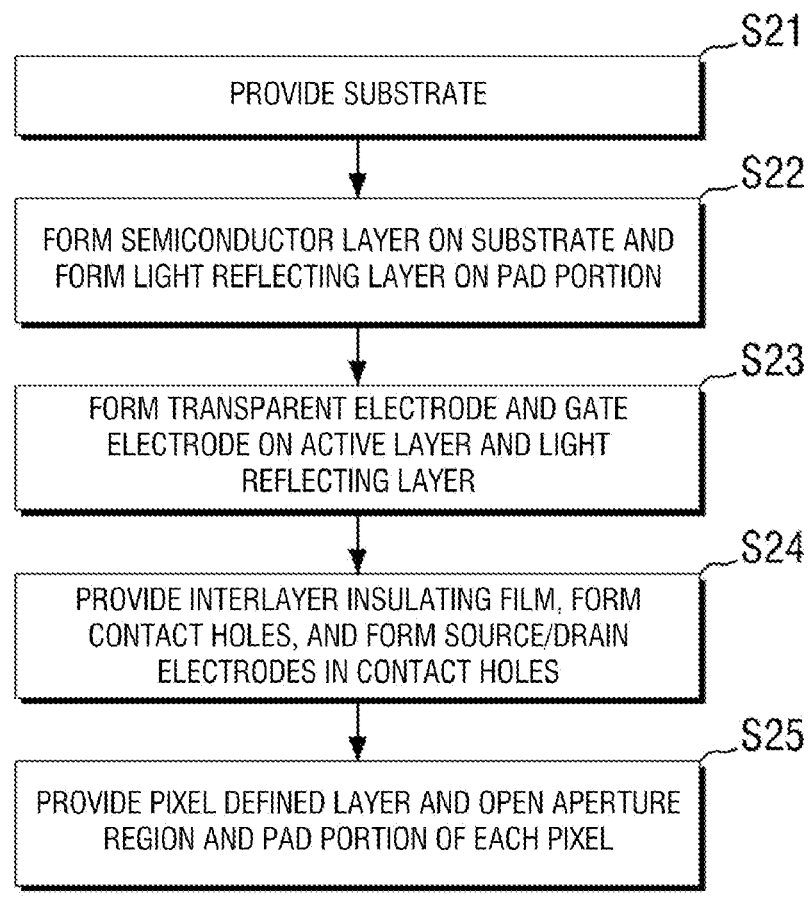
FIG. 11 is a flowchart illustrating an embodiment of a method of manufacturing an organic light-emitting display device.
Figure 12:
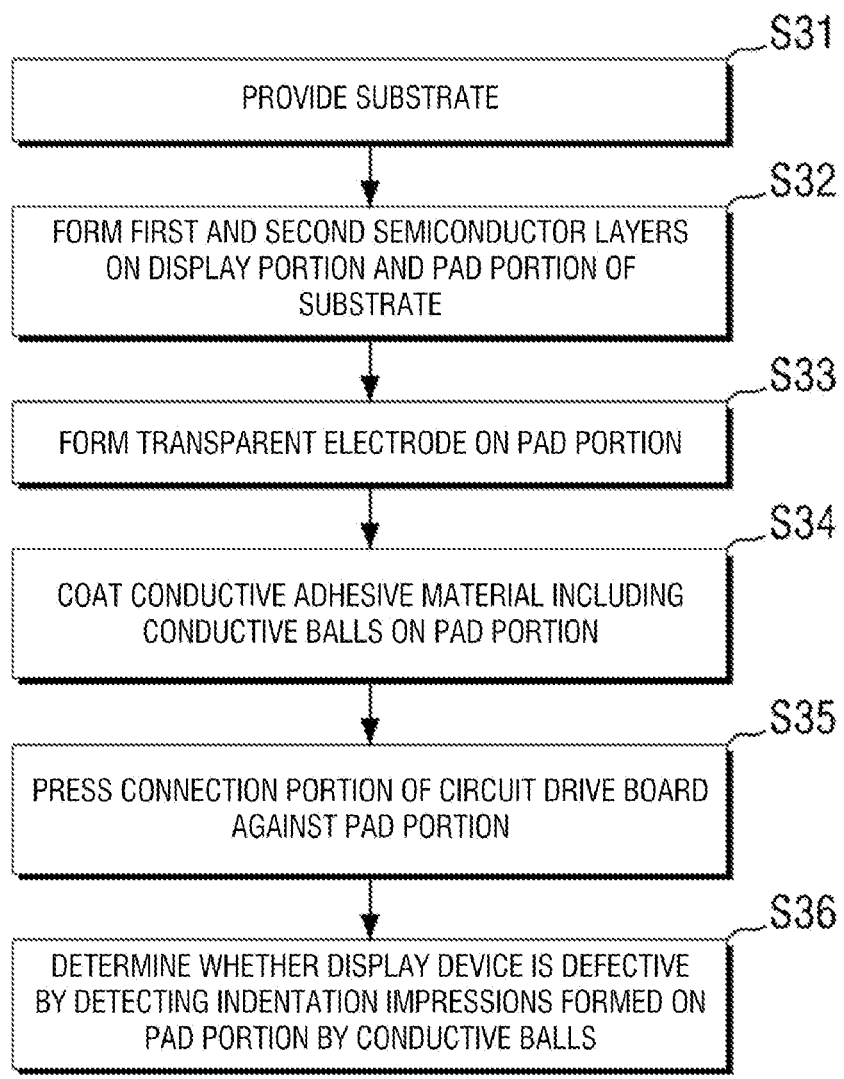
FIG. 12 is a flowchart illustrating another embodiment of a method of manufacturing an organic light-emitting display device.

Hereinafter, an embodiment of a method of manufacturing an organic light-emitting display device will be described with reference to FIGS. 11 and 12. FIG. 11 is a flowchart illustrating an embodiment of a method of manufacturing an organic light-emitting display device. FIG. 12 is a flowchart illustrating another method of manufacturing an organic light-emitting display device.

One embodiment of a method of manufacturing an organic light-emitting display device includes providing a transparent substrate which includes a display portion and a pad portion formed in a region around the display portion, forming a first semiconductor layer on the display portion of the transparent substrate and forming a second semiconductor layer on the pad portion, forming a transparent electrode on the second semiconductor layer, providing a drive circuit substrate having a connection portion which is connected to the transparent electrode, interposing a conductive adhesive layer between the transparent electrode and the connection portion, pressing the transparent electrode and the connection portion against each other to be attached to each other, and determining a connection state between the transparent electrode and the connection portion based on the shape of indentation impressions formed on the pad portion.

Specifically, a transparent substrate is provided (operation S21). As described above, the transparent substrate may be made of a transparent glass material containing $SiO_2$ as a main component. The transparent substrate may also be made of transparent plastic. The plastic that forms the transparent substrate may include an insulating organic material.

The transparent substrate may include a display portion on which a plurality of pixels defined by a plurality of data lines and a plurality of scan lines are formed, and a pad portion which is formed in a region around the display portion and transmits an external signal to each of the data lines and the scan lines.

A first semiconductor layer is formed on the display portion of the transparent substrate, and a second semiconductor layer is formed on the pad portion of the transparent substrate (operation S22). A plurality of TFTs and a plurality of capacitors are formed on the display portion of the transparent substrate, and each of the TFTs and each of the capacitors may include the first semiconductor layer which forms a switching element that can selectively transmit a signal. As described above, the first semiconductor layer may be made of various known semiconductor materials. In some embodiments, the first semiconductor layer may contain Si. The first semiconductor layer may be an a-Si layer or a p-Si layer. The first semiconductor layer may alternatively be made of, but not limited to, Ge, GaP, GaAs, or AlAs.

The second semiconductor layer may be formed on the pad portion at the same time as the first semiconductor layer. No additional material may be needed to form the second semiconductor layer. Instead, a material deposited on the whole surface of the transparent substrate to form the first semiconductor layer that constitutes each of the TFTs and each of the capacitors may be left on the pad portion in the shape of the second semiconductor layer, thereby forming a light reflecting layer (operation S32).

To form a TFT and a capacitor in each pixel, a material for forming the first semiconductor layer is deposited on the whole surface of the transparent substrate. The first semiconductor layer is formed by etching the material while leaving the material at a predetermined position of each of the TFTs and the capacitors that constitute the display portion. The material deposited in the region around the display portion is not entirely etched but is left in each part of the pad portion which is connected to a drive circuit board. As a result, the second semiconductor layer is formed. The second semiconductor layer can increase the protrusion detection rate.

Like the first semiconductor layer that forms each of the TFTs and the capacitors of the display portion, the first semiconductor layer may be an opaque material and may have a light reflectivity of about 40% or more as described above.

In some embodiments, an additional process of interposing a metal material between a buffer layer and a transparent electrode of the pad portion may be performed to form a light reflecting layer instead of the second semiconductor layer.

The transparent electrode and a gate electrode are formed on the first semiconductor layer and the second semiconductor layer (operation 23). The transparent electrode may be a transparent conductive material, for example, a metal oxide, such as ITO and/or IZO, or carbon nanotubes. The material that forms the transparent electrode may be deposited on the whole surface of the transparent substrate. The material may be deposited and patterned simultaneously in each TFT, each capacitor, a light-emitting portion and the pad portion to form the transparent electrode.

The gate electrode may contain one or more of Mo, Ti and Al or may be a multilayer of these materials, as described above.

Next, an interlayer insulating film is provided, contact holes are formed in the interlayer insulating film, and source/drain electrodes are formed in the contact holes (operation S24). The source/drain electrodes may be connected to the first semiconductor layer of the display portion. The gate electrode may be driven to transmit a signal, and an organic layer deposited on the transparent electrode of the light-emitting portion may emit light in response to the signal. The source/drain electrodes may contain one or more of Mo, Ti and Al.

A pixel defined layer is provided, and an aperture region and the pad portion of each pixel are opened to expose the transparent electrode (operation S25). The pixel defined layer may be made of silicon oxide and/or silicon nitride.

An organic panel manufactured as described above includes the second semiconductor layer under the transparent electrode of the pad portion. Thus, when the connection state between the pad portion and a connection portion of the drive circuit board is inspected, indentation impressions can be clearly detected.

A conductive adhesive layer including conductive balls is placed on the pad portion of the organic panel (operation S34), and the drive circuit board and the pad portion are pressed against each other (operation S35) to connect the drive circuit board and the organic panel.

The connection state between the drive circuit board and the organic panel is determined based on the shape of indentation impressions formed in the pad portion by the conductive balls. Ultimately, whether the organic light-emitting display device is defective can be determined based on the determined connection state.

The opaque second semiconductor layer formed on the pad portion may be partially deformed by the indentation impressions formed on the transparent electrode by the conductive balls. Therefore, even when the transparent electrode is formed on the pad portion, the indentation impressions can be clearly detected without an additional facility or an additional process.

Even when a conductive pad portion of an organic display panel is made of a transparent electrode, indentation impressions indicating a connection state between a connection portion of a drive circuit board and the transparent pad portion of the organic display panel can be clearly detected.

In addition, even in the case of a bottom emission organic light-emitting display device, the connection state between the connection portion of the drive circuit board and the transparent pad portion of the organic display panel can be clearly identified, thereby preventing production of defective display devices.

No additional facility is required since the existing production facility can be used. Accordingly, no additional cost for detection of the indentation impressions on the transparent pad portion is incurred.

The effects and advantages of the present invention are not restricted to those set forth herein. The above and other effects and advantages of the present invention will become more apparent to one of ordinary skill in the art to which the present invention pertains by referencing the appended claims.

What is claimed is:

1. An organic light-emitting display device comprising:
   a transparent substrate comprising a display portion and a pad portion, wherein the pad portion is formed in a region around the display portion;
   a first semiconductor layer formed on the display portion;
   a second semiconductor layer formed on the pad portion; and
   a transparent electrode formed on each of the first semiconductor layer and the second semiconductor layer,
   wherein the first semiconductor layer and the second semiconductor layer comprise the same material.

2. The display device of claim 1, further comprising a pixel defined layer formed on the display portion and the pad portion, wherein the pixel defined layer is configured to define the display portion and the pad portion, and to expose the transparent electrode formed on the second semiconductor layer.

3. The display device of claim 1, further comprising a drive circuit board, wherein the drive circuit board comprises:
   a plurality of circuit wirings formed on a surface of the drive circuit board;
   a connection portion formed on a side of the drive circuit board, wherein the connection portion is configured to contact the transparent electrode; and
   wherein the drive circuit board transmits a driving signal to the transparent electrode.

4. The display device of claim 3, wherein a conductive adhesive layer comprising a plurality of conductive balls is interposed between the transparent electrode and the connection portion.

5. The display device of claim 3, wherein the transparent electrode and the connection portion are pressed against each other to form indentation impressions on the transparent electrode formed on the second semiconductor layer.

6. The display device of claim 5, wherein the second semiconductor layer comprises protrusions and recesses formed by the indentation impressions formed on the transparent electrode.

7. The display device of claim 1, wherein each of the first and second semiconductor layers comprises polycrystalline silicon.

8. The display device of claim 1, wherein each of the first and second semiconductor layer has a light reflectivity of about 40% or more.

9. The display device of claim 1, further comprising source and drain electrodes disposed on the display portion and connected to the first semiconductor layer, wherein each of the source and drain electrodes comprises at least one of molybdenum, titanium and aluminum.

10. The display device of claim 1, further comprising a gate electrode formed on the transparent electrode formed on the first semiconductor layer, wherein the gate electrode comprises at least one of molybdenum, titanium and aluminum.

* * * * *